(12) United States Patent
Ray

(10) Patent No.: US 9,012,945 B2
(45) Date of Patent: Apr. 21, 2015

(54) YELLOW PHOSPHOR LAYER CONTAINING COLORED BEADS FOR ADJUSTING ITS PERCEIVED OFF-STATE COLOR

(71) Applicant: Nthdegree Technologies Worldwide Inc., Tempe, AZ (US)

(72) Inventor: William J. Ray, Fountain Hills, AZ (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 3 days.

(21) Appl. No.: 14/133,029

(22) Filed: Dec. 18, 2013

(65) Prior Publication Data

US 2014/0203316 A1   Jul. 24, 2014

Related U.S. Application Data

(60) Provisional application No. 61/754,874, filed on Jan. 21, 2013.

(51) Int. Cl.
*B32B 25/20* (2006.01)
*B32B 5/16* (2006.01)
*B05D 5/00* (2006.01)
*H01L 33/50* (2010.01)
*H01L 25/075* (2006.01)
*H05B 33/14* (2006.01)

(52) U.S. Cl.
CPC .......... *H01L 33/504* (2013.01); *H01L 25/0753* (2013.01); *H01L 2933/0091* (2013.01); *H05B 33/14* (2013.01)

(58) Field of Classification Search
CPC .............. H01L 33/504; H01L 25/0753; H01L 2933/0091; H05B 33/14
USPC ............ 428/447, 690, 480, 522, 412; 257/98, 257/13, E33.061; 345/83; 252/301.36
See application file for complete search history.

(56) References Cited

U.S. PATENT DOCUMENTS

| | | | |
|---|---|---|---|
| 2007/0031685 A1* | 2/2007 | Ko et al. | 428/447 |
| 2009/0180282 A1* | 7/2009 | Aylward et al. | 362/245 |
| 2010/0068321 A1* | 3/2010 | Errera | 425/96 |
| 2010/0188322 A1* | 7/2010 | Furukawa | 345/83 |
| 2012/0313045 A1* | 12/2012 | Shim | 252/301.36 |

* cited by examiner

*Primary Examiner* — Mark A Laurenzi
*Assistant Examiner* — Brian Turner
(74) *Attorney, Agent, or Firm* — Patent Law Group LLP; Brian D. Ogonowsky

(57) ABSTRACT

LED dies, emitting blue light, are provided on a first support substrate to form a light emitting layer. A mixture of a transparent binder, yellow phosphor powder, magenta-colored glass beads, and cyan-colored glass beads is printed over the light emitting surface. The mixture forms a wavelength conversion layer when cured. The beads are sized so that the tops of the beads protrude completely through the conversion layer. When the LED dies are on, the combination of the yellow phosphor light and the blue LED light creates white light. When the LEDs are off, white ambient light, such as sunlight, causes the conversion layer to appear to be a mixture of yellow light, magenta light, and cyan light. The percentage of the magenta and cyan beads in the mixture is selected to create a desired off-state color, such as a neutral color, of the conversion layer for aesthetic purposes.

18 Claims, 3 Drawing Sheets

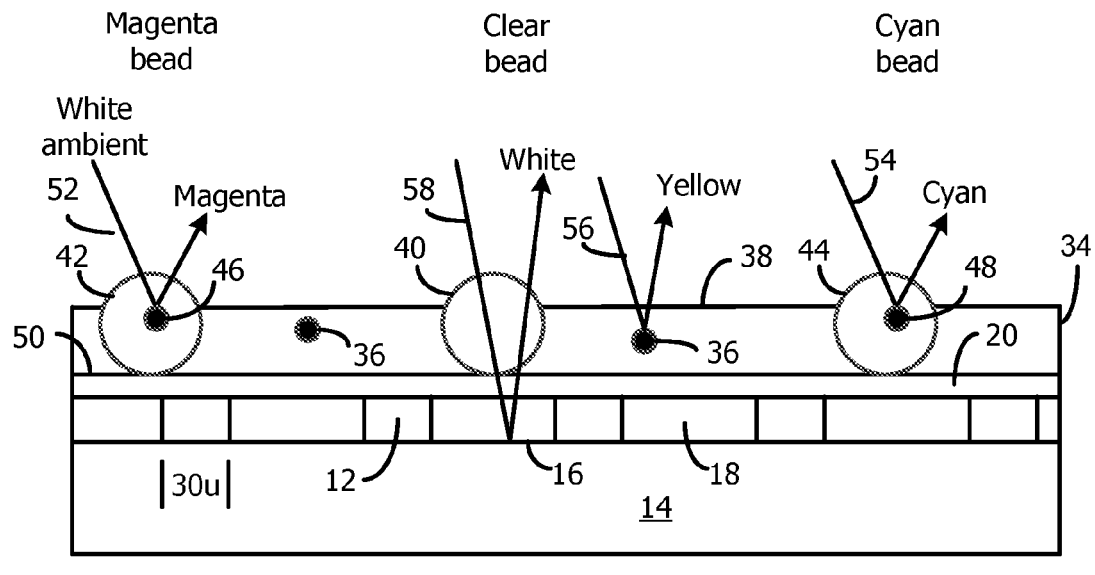
Fig. 3
$$(M*a) + (W*b) + (Y*c) + (C*d) = \text{off state color}$$
Fig. 4
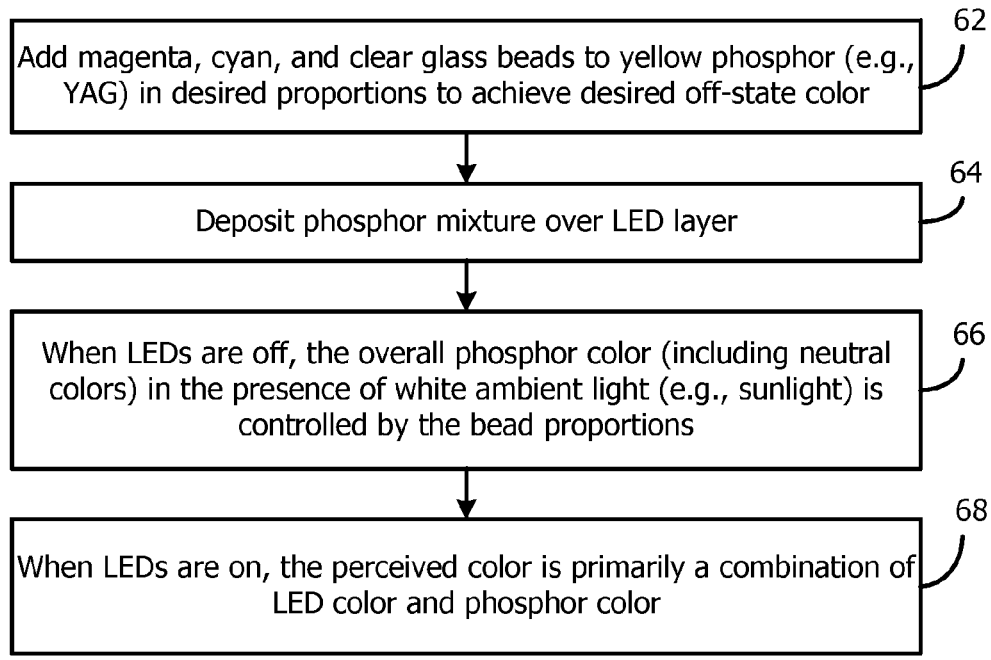
Fig. 5

YELLOW PHOSPHOR LAYER CONTAINING COLORED BEADS FOR ADJUSTING ITS PERCEIVED OFF-STATE COLOR

CROSS-REFERENCE TO RELATED APPLICATIONS

This application is based on and claims the benefit of U.S. Provisional Application Ser. No. 61/754,874, filed on Jan. 21, 2013, by William J. Ray, assigned to the present assignee and incorporated herein by reference.

FIELD OF THE INVENTION

This invention relates to phosphor layers, such as a YAG (yellow) phosphor layer that leaks a controlled amount of primary blue light and creates an overall white light emission, and, in particular, to a technique for controlling an off-state color of the YAG phosphor for aesthetic reasons.

BACKGROUND

It is common to provide a white light source by applying a yttrium aluminum garnet (YAG) phosphor layer over a blue light emitting diode (LED) die. The YAG phosphor emits a yellow light (also sometimes characterized as a yellow-green light) when energized by the blue light, and the combination of the blue light leaking through the phosphor layer and the yellow light creates white light. Many other colors can be created by combining phosphor light with LED light, and the invention is not limited to YAG phosphor or the use of LEDs.

FIG. 1 is a top down view of a portion of a substantially planar light emitting structure 10. FIG. 2 is a cross-sectional view of a very small portion of the structure 10 along line 2-2 in FIG. 1.

A layer of microscopic bare light emitting diode (LED) dies 12 is printed on a substrate 14, such as a metal substrate with a reflective surface 16, so that the bottom electrodes (e.g., anodes) of the LED dies 12 make electrical contact to a conductor (e.g., the metal substrate 14). A dielectric layer 18 is then printed to fill in the gaps between the LED dies 12, while exposing top electrodes (e.g., cathodes) of the LED dies 12. A transparent conductor layer 20 is then deposited over the LED dies 12 to electrically contact the top electrodes. Thin metal runners (not shown), connected to a metal bus 22, may be printed over the conductor layer 20 to provide a uniform voltage along the conductor layer 20. The metal bus 22 and the substrate 14 may be connected to a voltage source 24 for turning on the LED dies 12.

A YAG phosphor layer 26 is printed over the LED dies 12. The phosphor layer 26 includes YAG particles infused in a binder, and the phosphor layer 26 leaks a certain percentage of the blue LED die light.

In FIG. 1, the LED dies 12 are within the vertical strips 28, and the phosphor layer 26 is deposited over the entire surface of the structure 10.

If the LED dies 12 are GaN types and emit blue light, and the phosphor layer 26 emits yellow light upon being energized by the blue light, the resulting light will appear white.

When the LED dies 12 are in an off-state, white ambient light 30, such as sunlight, impinges on the phosphor layer 26 and energizes the phosphor particles, since the white light includes the wavelengths (e.g., blue) that energize the phosphor. So the entire surface of the light emitting structure 10 appears yellow (or yellow-green). This may not be an aesthetically pleasing color if the light emitting structure is an overhead light, such as a replacement for a conventional fluorescent troffer, where someone directly sees the front surface of the structure 10.

What is needed is a technique for adjusting the off-state color of a phosphor layer, such as a YAG phosphor layer, so the off-state color is more aesthetically pleasing.

SUMMARY

In one embodiment, a phosphor powder, such as YAG, is mixed in a transparent binder along with glass beads. The diameters of the beads should be slightly larger than the intended thickness of the phosphor layer over the LEDs so the beads will protrude through the phosphor layer. In one embodiment, the beads are about 50 microns in diameter. Some beads contain a dye, a powder, or other form of pigment to make some beads appear magenta and other beads appear cyan under white light, such as sunlight. Since the ambient white light includes the magenta and cyan wavelengths, those beads will appear magenta and cyan to an observer. Other beads are clear. In another embodiment, the beads contain quantum dots or other wavelength shifting material that causes the beads to emit magenta or cyan under white light, where the energizing wavelength in the white light is other than the LED peak wavelength or the phosphor wavelengths.

The proportions of the magenta, cyan, and transparent beads to each other and to the phosphor in the mixture will determine the off-state color of the phosphor layer under ambient white light. The yellow light is generated by excitation of the phosphor by, for example, the blue component in the white light. This assumes the phosphor is designed to be used with a blue LED. By combining the magenta, cyan, and yellow (phosphor) light, a wide gamut of colors may be created, including neutral shades (gray).

The present invention is equally effective with phosphors that are energized with other than blue light and emit colors other than yellow, although driving a yellow phosphor with blue LED light is the most common way to generate white light from LEDs.

The index of refraction of the glass beads should be close to, or less than, the index of the binder to minimize reflection. Suitable binders of selectable indices are commercially available. The beads may be glass that has been doped to have a selectable index.

The phosphor/bead mixture is deposited over the LED dies to have a substantially uniform thickness, where the thickness is set by the necessary LED light leakage through the phosphor layer to generate white light by the combination of the blue LED light and yellow light. Since neither the LED nor the phosphor generates any substantial magenta or cyan, the colored beads will not substantially affect the overall color when the LEDs are on. Accordingly, the invention only affects the off-state color and not the on-state color.

The colored beads will, however, reduce the efficiency of the white light source since the magenta and cyan pigments will block some of the LED light and phosphor light. Such a decrease in efficiency may be about 20%, depending on the mixture.

The addition of transparent beads to the mixture allows the blue LED light to freely pass through the phosphor layer to increase the blue light component of the white light to somewhat offset the light blockage by the magenta and cyan beads. Adding transparent beads also allows the phosphor layer to be thin and dense since the leakage can be controlled by the percentage weight of the transparent beads. Accordingly, process variations in the density, thickness, and uniformity of the phosphor layer will have little or no effect on the overall color emission of the phosphor-converted LED. The transparent beads also allow the white ambient light to directly pass through and be reflected back up (by a reflective layer) to add white light to the perceived off-state color. Accordingly, the transparent beads provide advantages in both the on-state and off-state with virtually no decrease in efficiency.

Since the beads are so small, the individual contributions from the beads are not perceptible from a normal viewing distance. Other bead colors may be used, where the combination of bead colors and phosphor color (when energized by white light) can create any desired color (including neutral colors) in the off-state.

In one embodiment, microscopic vertical LED dies, having widths of about 30 microns, are suspended in an LED ink and printed on a substrate. There may be millions of microscopic LED dies spread over the substrate to ultimately make a large-area white light source for general illumination purposes. The top electrodes of the LED dies are electrically contacted by a printed conductor, such as a transparent conductor layer, and the substrate may be metal and act as an anode or cathode conductor. The surface is planarized with a dielectric. The phosphor/bead mixture is then printed or sprayed over the LED dies. The beads will be uniformly distributed in the phosphor layer. A de-wetting agent may be added to the mixture to cause the binder/phosphor to de-wet off the tops of the beads by capillary action so that there is little or no phosphor over the tops of the beads.

In this way, a wide area, white light sheet, having a controllable off-state color, may be manufactured under atmospheric conditions. The light sheets may substitute for fluorescent light troffers.

The phosphor layer may be used over individual LED dies as well, such as over LED dies in a reflective cup.

The phosphor layer may be deposited over the LEDs or over an intermediate material, including a lens.

The phosphor layer may also be pre-formed as rigid or flexible tile or sheet that is affixed (e.g., laminated) to the top of an LED or over an array of LEDs.

Other embodiments are described.

BRIEF DESCRIPTION OF THE DRAWINGS

FIG. 3 illustrates the structure of FIGS. 1 and 2 but where the phosphor layer includes colored beads, and the bead colors combine with the phosphor color under ambient white light to produce an aesthetically pleasing color in the off-state.

FIG. 4 is an equation illustrating how the weight percentages of the beads with respect to the phosphor determine the perceived off-state color.

FIG. 5 is a flowchart describing the manufacture and use of the phosphor mixture containing the colored beads.

Elements that are the same or similar are labeled with the same numeral.

DETAILED DESCRIPTION

FIG. 3 illustrates an example of one type of arrangement of LEDs for use with the inventive phosphor layer 34. The LEDs can be in any configuration and can be any size. The inventive phosphor layer 34 can be used to cover only a single LED or can cover an array of LEDs. The particular light source is not important for the invention. If the light source is an LED die, the LED die may be any type of die (flip-chip, vertical, lateral, etc.) and emit any suitable color for energizing the phosphor layer, such as blue, UV, green, etc.

Figure 1:
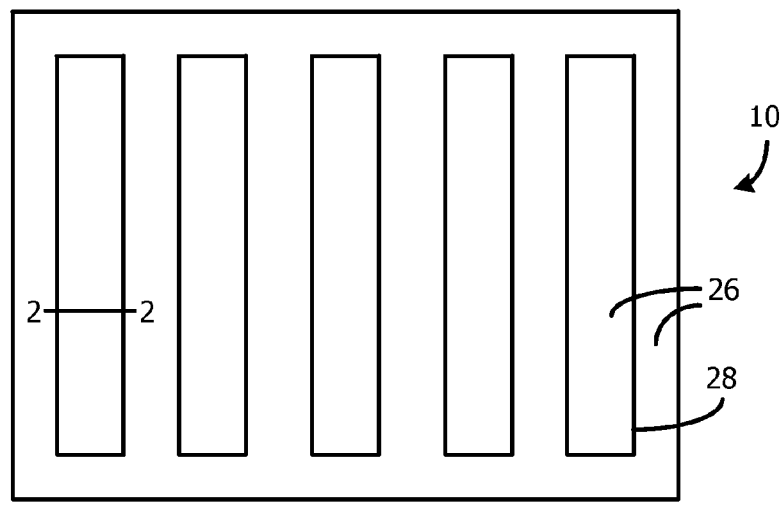
FIG. 1 is a top down view of a prior art substrate on which is printed strips of GaN-based blue LED dies, electrical conductors for supplying current to the LED dies, and a yellow (e.g., YAG) phosphor layer over the entire substrate for creating white light.
Figure 2:
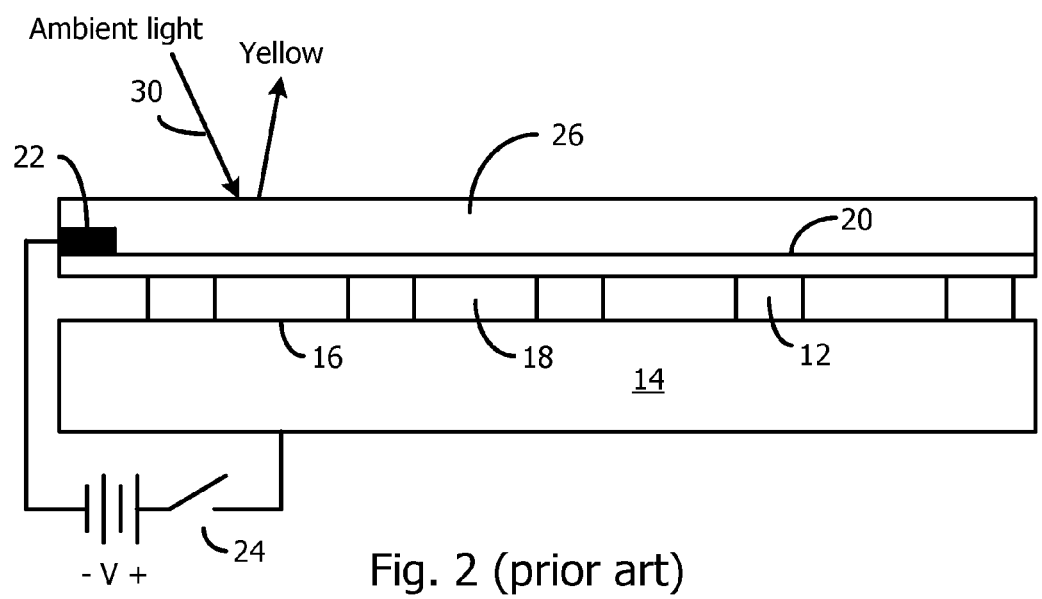
FIG. 2 is a cross-sectional view of a small portion of the substrate across line 2-2 in FIG. 1 showing the prior art structure, where, when the LED dies are off and white ambient light energizes the phosphor, the phosphor appears yellow to observers.

In the example of FIG. 3, the LEDs 12, substrate 14, dielectric 18, and transparent conductor layer 20 may be the same as shown in FIG. 2. The printing of such LED dies 12 is described in U.S. Pat. No. 8,415,879, incorporated herein by reference.

In one embodiment for forming the phosphor layer 34, ceramic phosphor particles 36 (e.g., a YAG powder) and glass beads are uniformly mixed in a transparent binder 38 to form a viscous mixture. The optimal viscosity depends on the deposition method, such as printing, spraying, etc. The glass beads are doped to have an index of refraction substantially matching, or less than, that of the binder 38 (e.g., silicone) to minimize reflection at the bead/binder interface. The glass beads comprise transparent beads 40, magenta beads 42, and cyan beads 44. Cyan and magenta were chosen since the combination of the yellow YAG phosphor, magenta, and cyan can be combined to create a neutral color (gray-scale), white light, or any other desired color. Printing using CMY inks is common to produce a wide gamut of colors. CMY colors are sometimes referred to as secondary colors, in contrast to blue, green, and red, which are generally referred to as primary colors.

The beads 42 and 44 may be colored by dyes or other forms of pigments infused in the glass when forming the beads. Enlarged pigment particles 46 and 48 are shown in the beads 42 and 44, and the beads 42 and 44 are uniformly infused with the microscopic pigment particles. Glass beads of selectable sizes and indices of refraction are commercially available, as are suitable magenta and cyan pigments. Binders of the pigments other than glass may also be used, and the binders do not need to be spherical. The beads should be small so as not to be individually perceived. In the embodiment of FIG. 3, the beads have a diameter of about 50 microns, and the phosphor layer 34 is somewhat less than 50 microns thick so the tops of the beads protrude through the phosphor layer 34.

The diameters of the beads 40/42/44/ may range from 25-500 μm, depending on the type of phosphor used, the density of phosphor, the color uniformity required, the required phosphor layer thickness, the overall color desired, and other factors. For example, in an application where the light will be viewed by an observer at a distance, uniformity of color across a wide array of LEDs is not critical, and the beads may be relatively large.

In one embodiment, to create the phosphor mixture, 48±4 μm diameter clear and colored glass beads are mixed with conventional YAG phosphor powder and a transparent binder in the desired percentages by weight as an ink suspension. The proper percentages will depend on the desired off-state color and materials used. The YAG phosphor may be any of several commercially available YAGs that are typically used in conjunction with a blue LED. The beads are available, or may be custom specified, from Potters Industries, Malvern, PS, USA. The binder 38 may consist of a 56.20%:32.20%: 5.00%:5.00%:0.50%:1.20% mixture of the chemicals listed in Table 1 below.

TABLE 1

Binder Materials.

| Material | Source | Function |
| --- | --- | --- |
| CN 9030 | Sartomer Exton, PA, USA | Polycarbonate - Urethane Acrylate Oligomer |
| CD 420 | Sartomer Exton, PA, USA | Acrylic Ester Monomer |
| CD 560 | Sartomer Exton, PA, USA | Diacrylate Cross-linking Agent |
| Irgacure 184 | Ciba, Basel, Switzerland | Photo Initiator, short UV wavelength |
| Irgacure 819 | Ciba, Basel, Switzerland | Photo Initiator, long UV wavelength |
| Modaflow 2100 | Cytec Industries, Woodland Park, NJ, USA | Flow aid |

The chemistry used in the binder 38 is quite polar. This polarity promotes the de-wetting of the glass beads 40/42/44 by both the binder 38 and the phosphor particles 36, thus allowing the beads 40/42/44 to protrude through the phosphor layer 34.

Many other suitable combinations of materials and ratios may be used to form the viscous mixture. The phosphor layer 34 may also include a red phosphor to create a warmer white light in the on-state.

The resulting mixture (an ink) is then screen printed using a 180 mesh screen with 80 µm open areas to evenly distribute the mixture over the support surface 50 of FIG. 3, which includes the transparent layer 20, thin metal traces (for good current spreading), and any other materials used for the light source. The deposited phosphor layer 34 is then cured, such as by heat or UV light. The resulting phosphor layer 34 in the particular example is about 25-40 microns thick. The LEDs 12 used in the example are medium brightness LEDs. The phosphor layer 34 would generally be thicker for high power blue LED so that the blue light leakage and the phosphor color contribution produce the desired white light.

Other forms of printing may be used, such as flexography or gravure. In another embodiment, the mixture is sprayed over the support surface 50. Other deposition techniques are envisioned, including a spin-on process. The optimal deposition process depends on the particular application. The support surface 50 may be any surface, including a lens, the LED itself, a surface remote from the light source, or a non-LED light source surface.

The invention still provides a benefit even if the phosphor layer 34 is slightly thicker than the diameter of the beads 40/42/44, or if some phosphor remains over the beads, since there will be very little absorption of the light exiting the beads from the thin layer of phosphor over the beads.

In the off-state, multi-wavelength, white ambient light, such as sunlight, impinges on the phosphor layer 34. The ambient light includes at least magenta and cyan wavelengths, as well as a wavelength (e.g., blue or UV) that energizes the phosphor particles 36. FIG. 3 shows a white light ray 52 being reflected off a magenta particle 46, where the magenta particle 46 basically only reflects the magenta wavelength in the light ray 52. Thus, the bead 42 appears magenta. Similarly, a white light ray 54 impinging on the cyan bead 44 causes the cyan bead 44 to appear cyan. A white light ray 56 energizing a YAG phosphor particle 36 creates a yellow light emission. A white light ray 58 passing through the transparent bead 40 reflects off a reflective surface 16 of the substrate 14 and may exit back through the bead 40 (creating a white off-state color dot) or may be converted to yellow light by a YAG particle. The clear beads 40 are optional. The percentages, by weight, of the phosphor, beads 40/42/44 and binder 38 determine the resulting off-state color.

FIG. 4 is a simplified equation illustrating how a designer can select the relative amounts (a, b, c, and d) of the off-state color components, Magenta, White, Yellow, and Cyan, to produce the overall off-state color in the presence of, for example, a certain temperature sunlight. The resulting off-state color depends on the intensities of the various wavelength components of the ambient light and may desirably change over the course of the day depending on the type of sunlight.

When the blue LED dies 12 are on, by applying a voltage across the conductor layer 20 and substrate 14 in the example, the blue light leaks though the phosphor layer 34 and also energizes the phosphor particles 36 to generate white light (or any other desired colored light). The clear beads 40 add efficiency and color-tunability by passing a precise amount of blue light irrespective of the thickness and density of the phosphor layer 34. The magenta beads 42 and cyan beads 44 reduce efficiency since they block some of the LED light. Since the LED dies 12 and phosphor particles 36 generate little or no magenta or cyan wavelengths, there will be insubstantial magenta and cyan contribution to the on-state color. An adequate design of the phosphor layer 34 can result in a white light off-state color having a correlated color temperature of 4000K with about a 20% loss in efficiency due to the addition of the magenta and cyan beads.

In another embodiment, instead of the colored beads containing magenta and cyan pigments, the magenta and cyan colors may be created by quantum dots or other wavelength conversion materials within glass beads, or otherwise supported in the phosphor mixture, which produce magenta and cyan in the presence of the ambient light. The wavelength conversions materials should not be energized with the LED light or the phosphor light in the on-state so as not to affect the on-state color.

In another embodiment, separate magenta and cyan beads are not required since the pigments may be combined into the same glass bead. However, there will be less flexibility in adjusting the desired off-state color.

FIG. 5 is a flowchart summarizing the manufacture and use of the phosphor mixture containing the colored beads. In step 62, the magenta, cyan, and clear beads are added to a yellow phosphor mixture in the desired proportions to achieve a desired off-state color under a particular white ambient light. The clear beads are optional.

In step 64, the resulting phosphor mixture is deposited over an LED layer, or over a single LED, or over any other light source. The phosphor mixture may be deposited as a liquid over the LEDs or may be pre-formed as a solid layer (identical to layer 34 in FIG. 3) separate from the LEDs and later laminated over the LEDs.

In step 66, when the LEDs are off, the overall phosphor color, in the presence of white ambient light, will be controlled by the bead proportions.

In step 68, when the LEDs are on, the perceived color is primarily a combination of the blue LED light and the phosphor light, where the magenta and cyan beads do not substantially affect the on-state color but reduce the efficiency of the lighting device.

Figure 6:
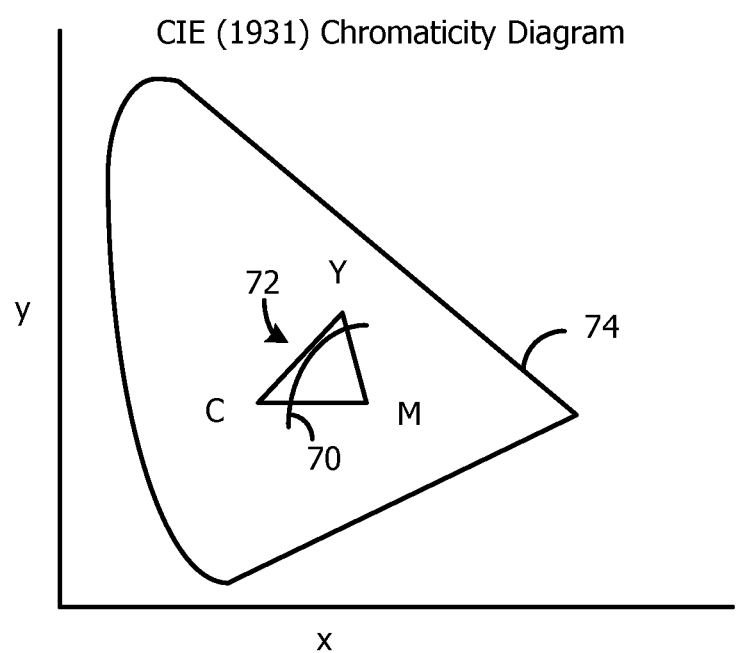
FIG. 6 is a CIE Chromaticity Diagram showing the Plankian locus (black-body radiation emission at different temperatures) and the gamut of off-state colors that may be created using the invention.

FIG. 6 is a standard CIE (1931) Chromaticity Diagram, using x and y chromaticity coordinates, showing the Plankian locus 70 (black-body radiation emission at different temperatures) and the gamut of off-state colors 72 that may be created using the yellow, magenta, and cyan combination of colors in the phosphor layer. The full gamut of colors 74 is that which may be achieved by using three primary colors. The corners of the triangle in the gamut of off-state colors 72 correspond to a practical maximum of yellow, a practical maximum of magenta, and a practical maximum of cyan, with the color in the interior of the triangle being achievable by combining amounts of yellow, magenta, and cyan.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting structure comprising:
    a phosphor mixture for being energized by a primary light source, the phosphor mixture comprising:
        phosphor particles, the phosphor particles generating a first color upon being energized by the primary light source and by ambient light impinging on the phosphor mixture;
        a second color pigment particle within the phosphor mixture reflecting the second color in the ambient light impinging on the phosphor mixture;
        a third color pigment particle within the phosphor mixture reflecting the third color in the ambient light impinging on the phosphor mixture; and
        a binder in which the phosphor particles, the second color pigment particle, and the third color pigment particle are infused,
    the phosphor mixture forming a layer positioned to be energized by the primary light source so as to create a color containing the first color when the primary light source is in an on-state, wherein the second color pigment particle and the third color pigment particle do not wavelength-convert light emitted by the primary light source so that they remain the same color while the primary light source is in an on-state or an off-state,
    wherein the phosphor mixture creates a color comprising the first color, the second color, and the third color when the primary light source is in the off-state and the phosphor mixture is illuminated by the ambient light.

2. The structure of claim 1 wherein the first color is generally yellow, the second color is magenta, and the third color is cyan.

3. The structure of claim 1 wherein the layer is deposited overlying one or more light emitting diodes (LEDs).

4. The structure of claim 3 wherein the first color is generally yellow and the one or more LEDs emit blue light, creating white light when the one or more LEDs are on.

5. The structure of claim 1 wherein the phosphor particles, the second color pigment particles, and the third color pigment particles are combined such that the layer appears to be neutral color in the ambient light.

6. The structure of claim 1 wherein the phosphor mixture further comprises transparent beads having a diameter equal to or greater than a thickness of the layer.

7. The structure of claim 1 wherein the second color pigment particle is contained in a plurality of first beads infused in the binder, and wherein the third color pigment particle is contained in a plurality of second beads infused in the binder.

8. The structure of claim 1 wherein a thickness of the layer is substantially equal to or less than a diameter of the second color pigment particle and the third color pigment particle.

9. The structure of claim 7 wherein the first beads and second beads are substantially spherical.

10. The structure of claim 7 wherein the first beads and the second beads comprise glass.

11. The structure of claim 10 wherein the glass has an index of refraction substantially the same as, or less than, an index of refraction of the binder.

12. The structure of claim 1 wherein the primary light source and the first color do not significantly contain wavelengths corresponding to the second color and the third color so that the second color pigment particle and the third color pigment particle do not affect an on-state color of the layer when the primary light source is energized.

13. The structure of claim 1 wherein the primary light source is a layer of light emitting diodes (LEDs).

14. The structure of claim 1 wherein the binder includes a de-wetting agent to promote the binder being removed from the second color pigment and the third color pigment.

15. The structure of claim 1 wherein the phosphor mixture is deposited over the primary light source as a liquid and cured.

16. The structure of claim 1 wherein the phosphor mixture is pre-formed as a solid structure and later affixed to the primary light source.

17. A phosphor mixture comprising:
    phosphor particles that generally appear yellow when energized by white ambient light;
    magenta beads containing a magenta pigment, wherein the magenta beads appear magenta in the white ambient light;
    cyan beads containing a cyan pigment, wherein the cyan beads appear cyan in the white ambient light; and
    a binder in which the phosphor particles, the magenta beads, and the cyan beads are infused,
    wherein the magenta beads and the cyan beads do not wavelength-convert light in the white ambient light,
    wherein relative amounts of the phosphor particles, magenta beads, and cyan beads cause the phosphor mixture to appear to be a non-yellow color under the white ambient light.

18. A light emitting structure comprising:
    a phosphor mixture for being energized by a primary light source, the phosphor mixture comprising:
        phosphor particles, the phosphor particles generating a first color upon being energized by the primary light source and by ambient light impinging on the phosphor mixture;
        a second color wavelength converting material within the phosphor mixture generating a second color upon being energized by the ambient light impinging on the phosphor mixture, the second color wavelength converting material not wavelength-converting light emitted by the primary light source when the primary light source is in an on-state;
        a third color wavelength converting material within the phosphor mixture generating a third color upon being energized by the ambient light impinging on the phosphor mixture, the third color wavelength converting material not wavelength-converting light emitted by the primary light source when the primary light source is in an on-state; and
        a binder in which the phosphor particles, the second color wavelength converting material, and the third color wavelength converting material are infused,
    the phosphor mixture forming a layer positioned to be energized by the primary light source so as to create a color containing the first color, but not the second color and the third color, when the primary light source is in an on-state, and wherein the phosphor mixture creates a color comprising the first color, the second color, and the third color when the primary light source is in an off-state and the phosphor mixture is illuminated by the ambient light.

* * * * *